(12) United States Patent
Anand

(10) Patent No.: US 7,098,747 B2
(45) Date of Patent: Aug. 29, 2006

(54) PRECISION TUNABLE VOLTAGE CONTROLLED OSCILLATION AND APPLICATIONS THEREOF

(75) Inventor: Seema B. Anand, Beverly Hills, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/836,876

(22) Filed: Apr. 30, 2004

(65) Prior Publication Data

US 2005/0242898 A1    Nov. 3, 2005

(51) Int. Cl.
H03B 5/12        (2006.01)
H03L 7/099       (2006.01)
H04B 7/00        (2006.01)

(52) U.S. Cl. .............................. 331/117 FE; 331/36 C; 331/117 R; 331/177 R; 331/177 V; 331/179; 455/260

(58) Field of Classification Search ................ 331/1 A, 331/8, 16–18, 25, 36 C, 117 R, 177 FE, 117 D, 331/175, 177 R, 179; 375/376; 455/260

See application file for complete search history.

(56) References Cited

U.S. PATENT DOCUMENTS 6,426,680 B1 * 7/2002 Duncan et al. ............... 331/34

* cited by examiner

*Primary Examiner*—David Mis
(74) *Attorney, Agent, or Firm*—Garlick Harrison & Markison; Timothy W. Markison

(57) ABSTRACT

A precision tunable VCO includes a bias transistor, a first inductor, a second inductor, a first input transistor, a second input transistor, a first capacitor, a second capacitor, a first precision tune capacitor circuit, and a second precision tune capacitor circuit. The bias transistor, the first and second inductors, the first and second input transistors, and the first and second capacitors are operably coupled to produce a differential output oscillation. The first precision tune capacitor circuit is operably coupled to the first leg of the differential output oscillation, wherein the first precision tune capacitor circuit provides a first precision capacitance value based on a calibration signal. The second precision tune capacitor circuit is operably coupled to the second leg of the differential output oscillation, wherein the second precision tune capacitor circuit provides a second precision capacitance value based on the calibration signal, wherein the control voltage, the first precision capacitance value, the second precision capacitance value, the first capacitor, the second capacitor, the first inductor, and the second inductor establish frequency of the differential output oscillation.

21 Claims, 5 Drawing Sheets

VCO 88 precision tuned capacitor
circuit 100 or 102

PLL 120

PRECISION TUNABLE VOLTAGE CONTROLLED OSCILLATION AND APPLICATIONS THEREOF

BACKGROUND OF THE INVENTION

1. Technical Field of the Invention

This invention related generally to frequency synthesis and more particularly to voltage controlled oscillators.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is further known, the one or more intermediate frequency stages of the receiver and of the transmitter each include a local oscillator to produce a local oscillation that is mixed with an incoming signal to produce an output of the intermediate frequency stage. Typically, a local oscillator includes a phase locked loop (PLL) to produce an oscillation that is used as the local oscillation or is processed to produce the local oscillation. A popular PLL architecture includes a phase and/or frequency detector, a charge pump, a loop filter, a voltage controlled oscillator (VCO), and a feedback module.

In operation, the phase and/or frequency detector compares phase and/or frequency of a reference oscillation (which is typically produced by a crystal oscillator) and a feedback oscillation (which is produced by the feedback module by dividing the output oscillation by a divider value). If the phase and/or frequency detector detects a difference between the phase and/or frequency of the reference oscillation and the feedback oscillation, it generates a difference signal. The difference signal may be a positive signal when the phase and/or frequency of the feedback oscillation leads the phase and/or frequency of the reference oscillation, which occurs when the output oscillation is greater than the desired rate. The difference signal may be a negative signal when the phase and/or frequency of the reference oscillation leads the phase and/or frequency of the feedback oscillation, which occurs when the output oscillation is less than the desired rate.

The charge pump is operably coupled to convert the difference signal into a positive current signal or a negative current signal depending on the state of the difference signal. The loop filter converts the positive or negative current into a control voltage, which is provided as the input to the VCO. The VCO generates the output oscillation based on the control voltage. For instance, the rate of the output oscillation increases as the control voltage increases due to a positive current, the rate of the output oscillation decreases as the control voltage decreases due a negative current, and the rate of the output oscillation remains constant for a constant control voltage.

There are a variety of ways to implement a voltage control oscillator including a ring oscillator and an inductor-capacitor based oscillator. In many radio transceiver applications, the inductor-capacitor based oscillator is used due to the high frequencies that need to be generated (e.g., 900 MHz to 5.75 GHz). When implemented on an integrated circuit, the inductor-capacitor based VCO typically provides a 10% frequency tuning range (i.e., the output oscillation range from minimum control voltage to maximum control voltage) once a local oscillation for a particular channel frequency has been selected (e.g., 2.4 GHz, 2.42 GHz, 2.44 GHz, etc.). To change the local oscillation for different channel frequencies, the capacitance of the inductor-capacitor based VCO is changed. For some radio transceiver applications, the tuning range needs to be about 0.5%.

Therefore, a need exists for a precision tunable voltage controlled oscillator (VCO) that has an accurate and small tuning range.

BRIEF SUMMARY OF THE INVENTION

The precision tunable voltage controlled oscillator (VCO) of the present invention substantially meets these needs and others. In one embodiment, a precision tunable VCO includes a bias transistor, a first inductor, a second inductor, a first input transistor, a second input transistor, a first capacitor, a second capacitor, a first precision tune capacitor circuit, and a second precision tune capacitor circuit. The bias transistor has a gate, a drain, and a source, wherein the gate of the bias transistor is operably coupled to a bias voltage and the source of the bias transistor is operably coupled to a power supply source. The first inductor has a first node and a second node, wherein the first node of the first inductor is operably coupled to the drain of the bias transistor. The second inductor has a first node and a second node, wherein the first node of the second inductor is operably coupled to the drain of the bias transistor. The first input transistor has a gate, a drain, and a source, wherein the drain of the first input transistor is operably coupled to the second node of the first inductor to provide a first leg of a differential output oscillation of the precision tunable VCO. The second input transistor has a gate, a drain, and a source, wherein the drain of the second input transistor is operably coupled to the second node of the second inductor to provide a second leg of the differential output oscillation, wherein the source of the first input transistor is operably coupled to the source of the second input transistor and to ground, wherein the gate of the second transistor is operably coupled to the first leg of the differential output oscillation and the gate of the first transistor is operably coupled to the second leg of the differential output oscillation. The first capacitor has a first node and a second node, wherein the first node of the first capacitor is operably coupled to receive a control voltage and the second node of the first capacitor is operably coupled to the first leg of the differential output oscillation. The second capacitor has a first node and a second node, wherein the first node of the second capacitor is operably coupled to receive the control voltage and the second node of the second capacitor is operably coupled to the second leg of the differential output oscillation. The first precision tune capacitor circuit is operably coupled to the first leg of the differential output oscillation, wherein the first precision tune capacitor circuit provides a first precision capacitance value based on a calibration signal. The second precision tune capacitor circuit is operably coupled to the second leg of the differential output oscillation, wherein the second precision tune capacitor circuit provides a second precision capacitance value based on the calibration signal, wherein the control voltage, the first precision capacitance value, the second precision capacitance value, the first capacitor, the second capacitor, the first inductor, and the second inductor establish frequency of the differential output oscillation. Such a precision tunable VCO may be used in a phase locked loop and/or in a radio transmitter.

DETAILED DESCRIPTION OF THE INVENTION

Figure 1:
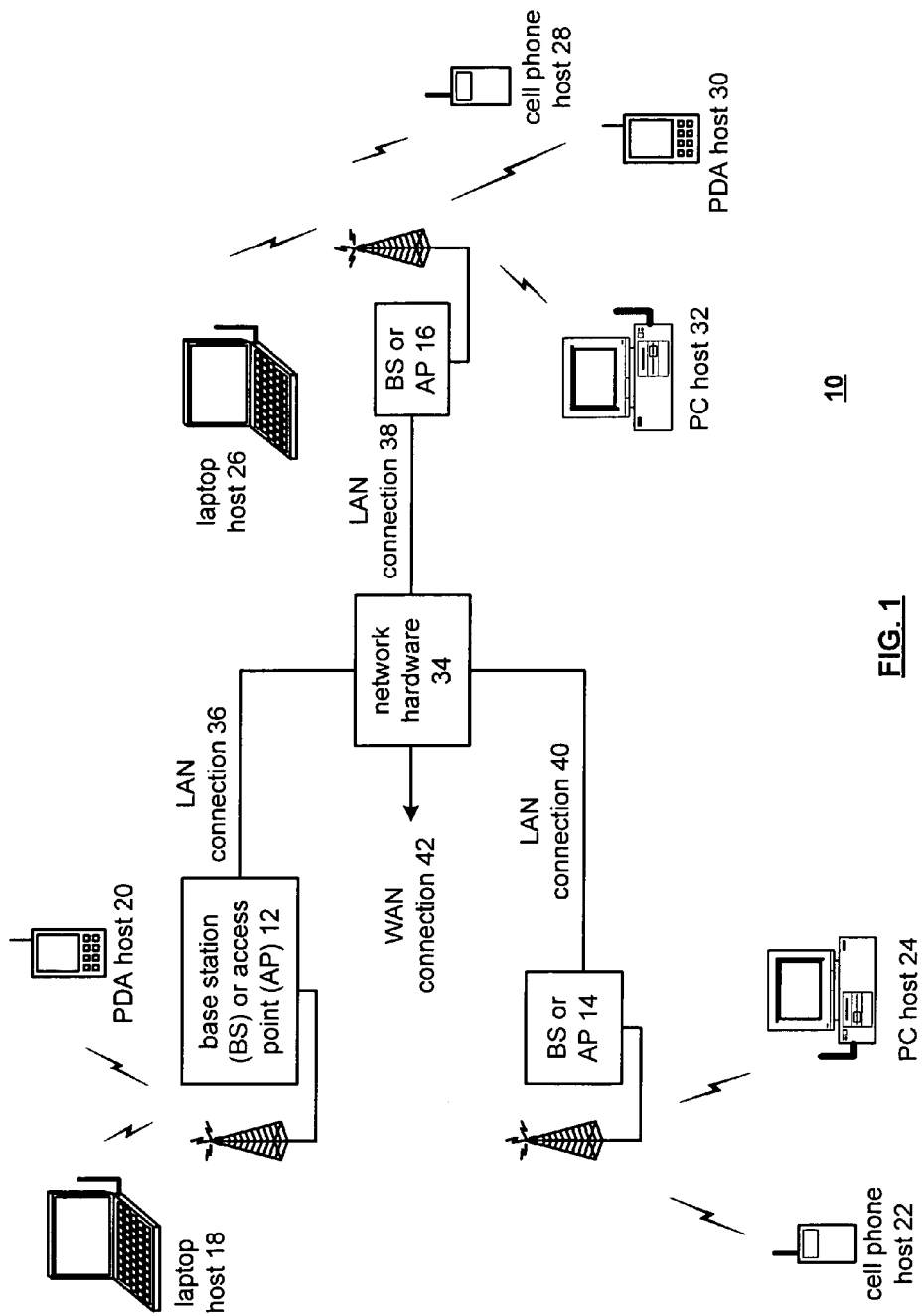
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
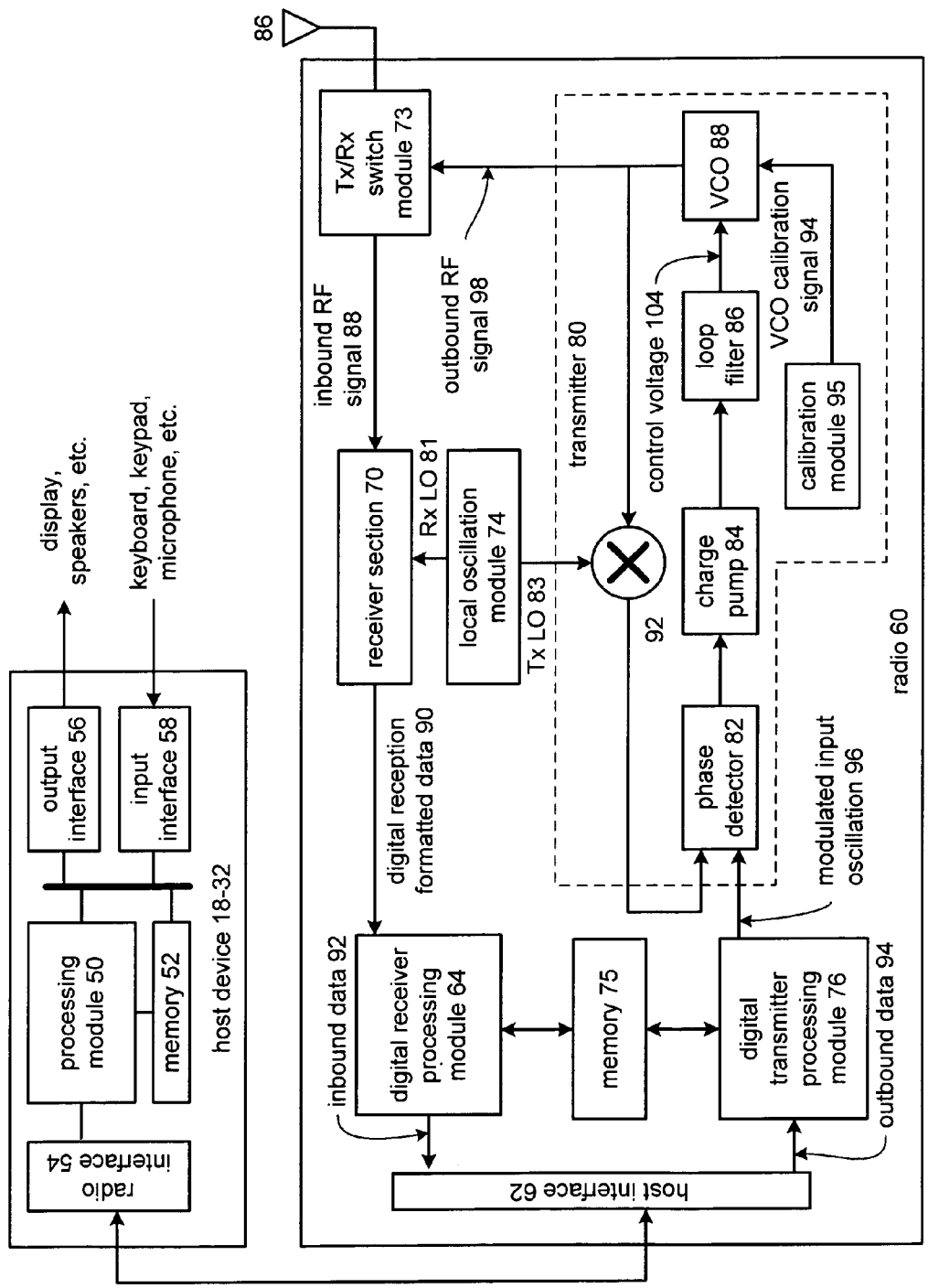
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

The radio 60 includes a host interface 62, a digital receiver processing module 64, receiver section 70, local oscillation module 74, transmit/receive switch module 73, transmitter section 80, memory 75, and digital transmitter processing module 76. The digital receiver processing module 64 and the digital transmitter processing module 76, in combination with operational instructions stored in memory 75, execute digital receiver functions and digital transmitter functions, respectively. The digital receiver functions include, but are not limited to digital intermediate frequency to baseband conversion, demodulation, constellation demapping, decoding, and/or descrambling. The digital transmitter functions include, but are not limited to scrambling, encoding, constellation mapping, modulation, and/or digital baseband to intermediate frequency conversions. The digital receiver and digital transmitter processing module 64 and 76 may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores information. Note that when the processing module 64 and/or 76 implements one or more of its functions via a state machine, analog circuitry, digital circuitry and/or logic circuitry, the memory storing the corresponding operational instructions is embedded within the circuitry comprising the state machine, analog circuitry, digital circuitry, and/or logic circuitry.

The radio 60 receives inbound radio frequency signals via antenna 86. In a receive mode, the transmit/receive switch module 73 provides the inbound radio frequency signals 88 to the receiver section 70. Based on a receiver local oscillation 81 provided by the local oscillation module 74, the receiver section 70 converts the inbound radio frequency signals 88 into digital reception formatted data 90. The digital reception formatted data 90 are in a digital format and may correspond to symbols representing data. The digital receiver processing module 64 processes the digital reception formatted data 90 to produce inbound data 92 which is subsequently provided to the host device 18–32.

The digital transmitter processing module 76 is operably coupled to convert outbound data 94 into modulated input oscillations 96 in accordance with one or more wireless communication standards. For instance, the digital transmitter processing module 76 may process the outbound data 94 in accordance with the GSM standard or other wireless communication standard to produce the modulated input oscillation 96.

The transmitter 80 includes a phase detector 82, a charge pump 84, a loop filter 86, a voltage controlled oscillator 88, a calibration module 95 and a mixer 92. The phase detector 82 is operably coupled to receive the modulated input oscillation 96 and compares it with a feedback oscillation received via mixer 92. If a phase difference exists between the feedback oscillation and the modulated input oscillation 96, the phase detector 82 produces a difference signal.

The charge pump 84 converts the difference signal into a positive current or negative current which is provided to the loop filter 86. The loop filter 86 converts the positive current and/or negative current into a control voltage 104. The voltage controlled oscillator 88, based on the control voltage 104 and a voltage calibration signal 94, produces the outbound RF signals 98. The calibration module 95 produces the VCO calibration signal 94 during a calibration of the transmitter 80. Such a calibration process may be done as described in co-pending patent application entitled PHASE LOCKED LOOP CALIBRATION, having a filing date of Dec. 19, 2003 and a serial number of 10/742,489.

The mixer 92 mixes the output RF signal 98 with a transmit local oscillation 83 to produce the feedback oscillation. The local oscillation module 74 produces the transmit local oscillation 83. The local oscillation module 74 may include a phase locked loop as illustrated and described with reference to FIG. 5.

Figure 3:
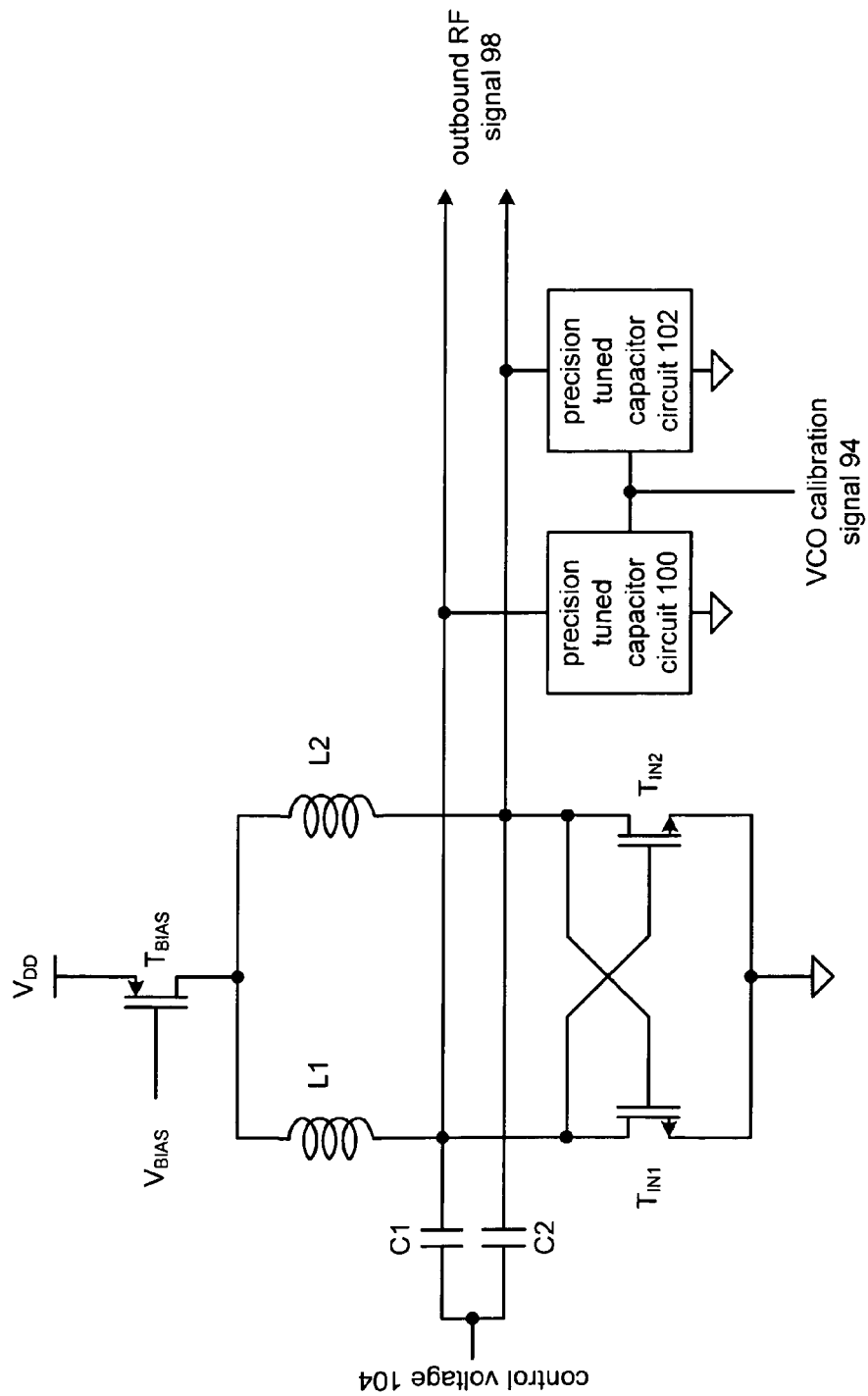
FIG. 3 is a schematic block diagram of a voltage controlled oscillator in accordance with the present invention.

FIG. 3 illustrates a schematic block diagram of the voltage controlled oscillator 88 which includes $1^{st}$ and $2^{nd}$ inductors (L1, L2), input capacitors (C1, C2), input transistors ($T_{in1}$ and $T_{in2}$), a bias transistor ($T_{bias}$) and two precision tuned capacitor circuits 100 and 102. The input capacitor C1 and C2, which may be a variable capacitor bank and/or a varactor, has a capacitance value to resonate with the inductance of inductors L1 and L2 at the desired rate of the output oscillation. As is known, the resonant frequency of an LC circuit is based on the equation $F=1/(2\pi$ times the square root of LC), where F corresponds to frequency, L equals the inductance of the inductor and C is the capacitance of the capacitor. For example, the inductance of inductors L1 and L2 may be approximately 1 nano-Henry and the input capacitor C1 and C2 may be in the range of 1–4 pico-farads, producing a resonant frequency in the range of a few giga-Hertz (GHz).

The input capacitors C1 and C2 receive control voltage 104 and, in combination with the inductors and switching of the input transistors, generate a resonant output oscillation, which corresponds to the outbound radio frequency signal 98. To provide fine tuning to maintain a very small tuning range (e.g., of approximately 0.5%), the precision tuned capacitor circuits 100 and 102 adjust the overall capacitance of the LC based VCO in accordance with the VCO calibrations signal 94. The precision tuned capacitor circuits 100 and 102 are shown in greater detail with reference to FIG. 4.

Figure 4:
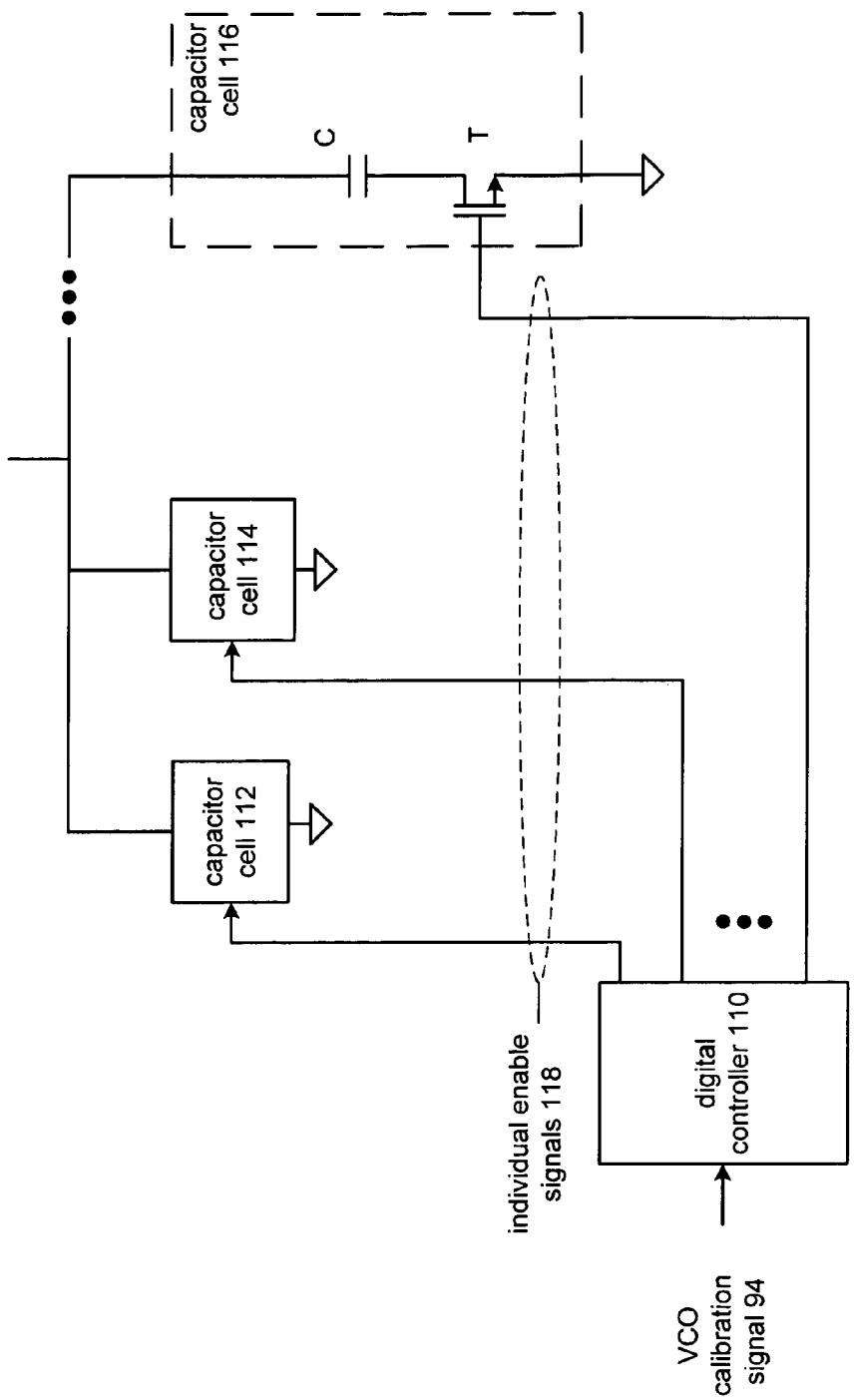
FIG. 4 is a schematic block diagram of a precision tuned capacitor circuit in accordance with the present invention.

FIG. 4 illustrates the precision tuned capacitor circuits 100 and/or 102 to include a digital controller 110, and a plurality of capacitor cells 112–116. The digital controller 110, which may be a thermometer encoder, receives the VCO calibration signal 94 and produces a plurality of individual enable signals 118 that are provided to each of the capacitor cells 112–116.

Each capacitor cell includes a capacitor C and a transistor T. When its corresponding individual enable signal 118 is high, the transistor is on such that the capacitor is coupled between the outbound RF signal 98 and circuit ground. The capacitance value of the capacitor within each capacitor cell 116 may range from a few femto-farads to a few pico-farads. Further, the number of capacitor cells 112–116 may range from a few cells to hundreds of cells depending on the granularity of the capacitor tuning. Accordingly, based on the digital value of the VCO calibration signal 94, the digital controller 110 will enable one or more of the capacitor cells 112–116 to provide precision tuning of the output oscillation of the VCO.

Figure 5:
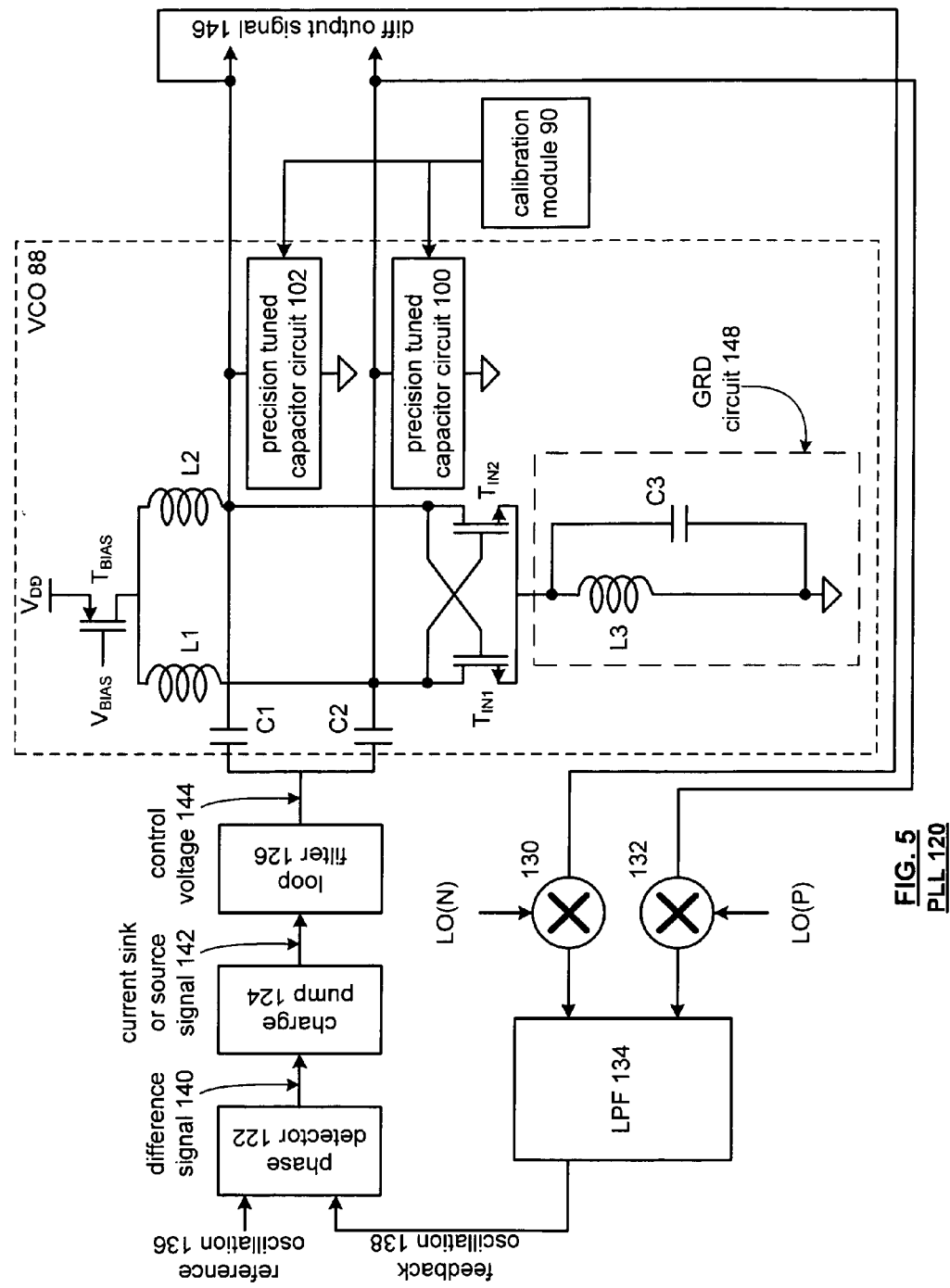
FIG. 5 is a schematic block diagram of a phase locked loop in accordance with the present invention.

FIG. 5 is a schematic block diagram of a phase locked loop 120 that includes a phase detector 122, a charge pump 124, a loop filter 126, a voltage controlled oscillator 88, a pair of feedback mixers 130 and 132 and a low-pass filter 134. The voltage controlled oscillator 88 includes the bias transistor, the 1$^{st}$ and 2$^{nd}$ inductors, the 1$^{st}$ and 2$^{nd}$ input capacitors, the 1$^{st}$ and 2$^{nd}$ input transistors, the precision tuned capacitor circuits 100 and 102 and may further include a ground circuit 148. The ground circuit includes a pair of inductors L3 and L4 and a capacitor C3. The inductance and capacitance of these components is selected to resonate at and around the frequency corresponding to the outbound RF signal.

In operation, the phase detector 122 compares a reference oscillation 136 with a feedback oscillation 138 to produce a difference signal 140. The charge pump 124 converts the difference signal 140 into a current sync or a current source signal 142. The loop filter 126 converts the current sync or source signal 142 into a control voltage 144.

As previously described, the voltage controlled oscillator 88 converts the control voltage 144 into a differential output oscillation signal 146, which is fed to the 1$^{st}$ and 2$^{nd}$ feedback mixers 130 and 132.

Feedback mixer 130 mixes one leg of the differential output oscillation 146 with one leg of a local oscillation LO(N). The 2$^{nd}$ feedback mixer 132 mixes the other leg of the differential output oscillation signal 146 with the other leg of a local oscillation LO(P). The output of each mixer 130 and 132 is filtered via low-pass filter 134 to produce the feedback oscillation 138.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a precision tunable voltage controlled oscillator that may be used within a radio transmitter and/or phase locked loop. As one of average skill in the art will appreciate, other embodiments may be derived from the teaching of the present invention without deviating from the scope of the claims.

What is claimed is:

1. A precision tunable voltage controlled oscillator (VCO) comprises:
   a bias transistor having a gate, a drain, and a source, wherein the gate of the bias transistor is operably coupled to a bias voltage and the source of the bias transistor is operably coupled to a power supply source;
   a first inductor having a first node and a second node, wherein the first node of the first inductor is operably coupled to the drain of the bias transistor;
   a second inductor having a first node and a second node, wherein the first node of the second inductor is operably coupled to the drain of the bias transistor;
   a first input transistor having a gate, a drain, and a source, wherein the drain of the first input transistor is operably coupled to the second node of the first inductor to provide a first leg of a differential output oscillation of the precision tunable VCO;
   a second input transistor having a gate, a drain, and a source, wherein the drain of the second input transistor is operably coupled to the second node of the second inductor to provide a second leg of the differential output oscillation, wherein the source of the first input transistor is operably coupled to the source of the second input transistor and to ground, wherein the gate of the second transistor is operably coupled to the first leg of the differential output oscillation and the gate of the first transistor is operably coupled to the second leg of the differential output oscillation;
   a first capacitor having a first node and a second node, wherein the first node of the first capacitor is operably coupled to receive a control voltage and the second node of the first capacitor is operably coupled to the first leg of the differential output oscillation;
   a second capacitor having a first node and a second node, wherein the first node of the second capacitor is operably coupled to receive the control voltage and the second node of the second capacitor is operably coupled to the second leg of the differential output oscillation;
   a first precision tune capacitor circuit operably coupled to the first leg of the differential output oscillation, wherein the first precision tune capacitor circuit provides a first precision capacitance value based on a calibration signal, in which a range of the first precision capacitance value selected is to maintain a precision tuning range of approximately 0.5%; and
   a second precision tune capacitor circuit operably coupled to the second leg of the differential output oscillation, wherein the second precision tune capacitor circuit provides a second precision capacitance value based on the calibration signal, in which a range of the second precision capacitance value selected is to maintain a precision tuning range of approximately 0.5%, wherein the control voltage, the first precision capacitance value, the second precision capacitance value, the first capacitor, the second capacitor, the first inductor, and the second inductor establish frequency of the differential output oscillation.

2. The precision tunable VCO of claim 1, wherein each of the first and second capacitors comprises:
   a variable capacitance circuit, wherein a capacitance value of the variable capacitance circuit is at least partially established based on a channel select signal.

3. The precision tunable VCO of claim 2, wherein the variable capacitance circuit comprises a varactor.

4. The precision tunable VCO of claim 1, wherein each of the first and second precision tune capacitor circuits comprises:
- a plurality of capacitor cells operably coupled in parallel and individually enabled; and
- a digital controller operably coupled to convert the calibration signal into individual enable signals for individual ones of the plurality of capacitor cells.

5. The precision tunable VCO of claim 4, wherein each of the plurality of capacitor cells comprises:
- a capacitor having a first node and a second node; and
- a transistor having a gate, a drain, and a source, wherein the second node of the capacitor is coupled to the drain of the transistor, wherein the gate of the transistor is operably coupled to receive one of the individual enable signals, and wherein the first node of the capacitor and the source of the transistor provide connections for the capacitor cell.

6. The precision tunable VCO of claim 4, wherein the digital controller comprises a thermometer coder.

7. The precision tunable VCO of claim 1 further comprises:
- a high frequency ground circuit to provide the operable coupling between ground and the sources of the first and second input transistors.

8. A phase locked loop comprises:
- a phase detector operably coupled to produce a difference signal based on a phase difference between a reference oscillation and a feedback oscillation;
- a charge pump operably coupled to convert the difference signal into current sink signal or a current source signal;
- a loop filter operably coupled to convert the current sink signal and the current source signal into a control voltage;
- a precision voltage controlled oscillator operably coupled to produce a differential output oscillation based on the control voltage and a VCO calibration signal;
- a mixer operably coupled to mix the differential output oscillation with a local oscillation to produce a mixed oscillation;
- a low pass filter operably coupled to filter the mixed oscillation to produce the feedback oscillation; and
- a calibration module operably coupled to produce the VCO calibration signal based on a calibration of the RF transmitter, wherein the precision voltage controlled oscillator includes:
  - a bias transistor having a gate, a drain, and a source, wherein the gate of the bias transistor is operably coupled to a bias voltage and the source of the bias transistor is operably coupled to a power supply source;
  - a first inductor having a first node and a second node, wherein the first node of the first inductor is operably coupled to the drain of the bias transistor;
  - a second inductor having a first node and a second node, wherein the first node of the second inductor is operably coupled to the drain of the bias transistor;
  - a first input transistor having a gate, a drain, and a source, wherein the drain of the first input transistor is operably coupled to the second node of the first inductor to provide a first leg of the differential output oscillation;
  - a second input transistor having a gate, a drain, and a source, wherein the drain of the second input transistor is operably coupled to the second node of the second inductor to provide a second leg of the differential output oscillation, wherein the source of the first input transistor is operably coupled to the source of the second input transistor and to ground, wherein the gate of the second transistor is operably coupled to the first leg of the differential output oscillation and the gate of the first transistor is operably coupled to the second leg of the differential output oscillation;
  - a first capacitor having a first node and a second node, wherein the first node of the first capacitor is operably coupled to receive a control voltage and the second node of the first capacitor is operably coupled to the first leg of the differential output oscillation;
  - a second capacitor having a first node and a second node, wherein the first node of the second capacitor is operably coupled to receive the control voltage and the second node of the second capacitor is operably coupled to the second leg of the differential output oscillation;
  - a first precision tune capacitor circuit operably coupled to the first leg of the differential RF output oscillation, wherein the first precision tune capacitor circuit provides a first precision capacitance value based on a calibration signal, in which a range of the first precision capacitance value selected is to maintain a precision tuning range of approximately 0.5%; and
  - a second precision tune capacitor circuit operably coupled to the second leg of the differential RF output oscillation, wherein the second precision tune capacitor circuit provides a second precision capacitance value based on the calibration signal, in which a range of the second precision capacitance value selected is to maintain a precision tuning range of approximately 0.5%, wherein the control voltage, the first precision capacitance value, the second precision capacitance value, the first capacitor, the second capacitor, the first inductor, and the second inductor establish frequency of the differential RF output oscillation.

9. The phase locked loop of claim 8, wherein each of the first and second capacitors comprises:
- a variable capacitance circuit, wherein a capacitance value of the variable capacitance circuit is at least partially established based on a channel select signal.

10. The phase locked loop of claim 9, wherein the variable capacitance circuit comprises a varactor.

11. The phase locked loop of claim 8, wherein each of the first and second precision tune capacitor circuits comprises:
- a plurality of capacitor cells operably coupled in parallel and individually enabled; and
- a digital controller operably coupled to convert the calibration signal into individual enable signals for individual ones of the plurality of capacitor cells.

12. The phase locked loop of claim 11, wherein each of the plurality of capacitor cells comprises:
- a capacitor having a first node and a second node; and
- a transistor having a gate, a drain, and a source, wherein the second node of the capacitor is coupled to the drain of the transistor, wherein the gate of the transistor is operably coupled to receive one of the individual enable signals, and wherein the first node of the capacitor and the source of the transistor provide connections for the capacitor cell.

13. The phase locked loop of claim 11, wherein the digital controller comprises a thermometer coder.

14. The phase locked loop of claim 8 further comprises:
a high frequency ground circuit to provide the operable coupling between ground and the sources of the first and second input transistors.

15. A radio frequency (RE) transmitter comprises:
a phase detector operably coupled to produce a difference signal based on a phase difference between a modulated input oscillation and a feedback oscillation;
a charge pump operably coupled to convert the difference signal into current sink signal or a current source signal;
a loop filter operably coupled to convert the current sink signal and the current source signal into a control voltage;
a precision voltage controlled oscillator operably coupled to produce a differential RF output oscillation based on the control voltage and a VCO calibration signal;
a mixer operably coupled to mix the differential RE output oscillation with a local oscillation to produce a mixed oscillation;
a low pass filter operably coupled to filter the mixed oscillation to produce the feedback oscillation; and
a calibration module operably coupled to produce the VCO calibration signal based on a calibration of the phase locked loop, wherein the precision voltage controlled oscillator includes:
   a bias transistor having a gate, a drain, and a source, wherein the gate of the bias transistor is operably coupled to a bias voltage and the source of the bias transistor is operably coupled to a power supply source;
   a first inductor having a first node and a second node, wherein the first node of the first inductor is operably coupled to the drain of the bias transistor;
   a second inductor having a first node and a second node, wherein the first node of the second inductor is operably coupled to the drain of the bias transistor;
   a first input transistor having a gate, a drain, and a source, wherein the drain of the first input transistor is operably coupled to the second node of the first inductor to provide a first leg of a differential RF output oscillation;
   a second input transistor having a gate, a drain, and a source, wherein the drain of the second input transistor is operably coupled to the second node of the second inductor to provide a second leg of the differential RF output oscillation, wherein the source of the first input transistor is operably coupled to the source of the second input transistor and to ground, wherein the gate of the second transistor is operably coupled to the first leg of the differential RF output oscillation and the gate of the first transistor is operably coupled to the second leg of the differential RF output oscillation;
   a first capacitor having a first node and a second node, wherein the first node of the first capacitor is operably coupled to receive a control voltage and the second node of the first capacitor is operably coupled to the first leg of the differential RF output oscillation;
   a second capacitor having a first node and a second node, wherein the first node of the second capacitor is operably coupled to receive the control voltage and the second node of the second capacitor is operably coupled to the second leg of the differential RF output oscillation;
   a first precision tune capacitor circuit operably coupled to the first leg of the differential output oscillation, wherein the first precision tune capacitor circuit provides a first precision capacitance value based on a calibration signal in which a range of the first precision capacitance value selected is to maintain a precision tuning range of approximately 0.5%; and
   a second precision tune capacitor circuit operably coupled to the second leg of the differential output oscillation, wherein the second precision tune capacitor circuit provides a second precision capacitance value based on the calibration signal, in which a range of the second precision capacitance value selected is to maintain a precision tuning range of approximately 0.5%, wherein the control voltage, the first precision capacitance value, the second precision capacitance value, the first capacitor, the second capacitor, the first inductor, and the second inductor establish frequency of the differential RF output oscillation.

16. The RF transmitter of claim 15, wherein each of the first and second capacitors comprises:
a variable capacitance circuit, wherein a capacitance value of the variable capacitance circuit is at least partially established based on a channel select signal.

17. The RF transmitter of claim 16, wherein the variable capacitance circuit comprises a varactor.

18. The RF transmitter of claim 15, wherein each of the first and second precision tune capacitor circuits comprises:
a plurality of capacitor cells operably coupled in parallel and individually enabled; and
a digital controller operably coupled to convert the calibration signal into individual enable signals for individual ones of the plurality of capacitor cells.

19. The RF transmitter of claim 18, wherein each of the plurality of capacitor cells comprises:
a capacitor having a first node and a second node; and
a transistor having a gate, a drain, and a source, wherein the second node of the capacitor is coupled to the drain of the transistor, wherein the gate of the transistor is operably coupled to receive one of the individual enable signals, and wherein the first node of the capacitor and the source of the transistor provide connections for the capacitor cell.

20. The RF transmitter of claim 18, wherein the digital controller comprises a thermometer coder.

21. The RF transmitter of claim 15 further comprises:
a high frequency ground circuit to provide the operable coupling between ground and the sources of the first and second input transistors.

* * * * *